(12) United States Patent
Chang (10) Patent No.: US 7,262,502 B2
(45) Date of Patent: Aug. 28, 2007

(54) PHASE-CHANGE RANDOM ACCESS MEMORY DEVICE AND METHOD FOR MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 318 days.

(21) Appl. No.: 11/000,179

(22) Filed: Nov. 30, 2004

(65) Prior Publication Data
US 2006/0001164 A1   Jan. 5, 2006

(30) Foreign Application Priority Data
Jun. 30, 2004  (KR) .................. 10-2004-0050122

(51) Int. Cl.
*H01L 23/48* (2006.01)
*H01L 23/52* (2006.01)
*H01L 29/40* (2006.01)
*H01L 21/00* (2006.01)

(52) U.S. Cl. .............. 257/758; 257/2; 257/3; 257/E27.004; 438/95; 438/239

(58) Field of Classification Search ......... 257/758, 257/2, E27.004; 438/95
See application file for complete search history.

(56) References Cited

U.S. PATENT DOCUMENTS

| 6,791,102 | B2 * | 9/2004 | Johnson et al. ............ 257/3 |
| 6,943,395 | B2 * | 9/2005 | Oh et al. ............ 257/295 |
| 6,969,866 | B1 * | 11/2005 | Lowrey et al. ............ 257/3 |
| 2003/0209746 | A1 * | 11/2003 | Horii ............ 257/295 |
| 2004/0166604 | A1 * | 8/2004 | Ha et al. ............ 438/102 |
| 2005/0130414 | A1 * | 6/2005 | Choi et al. ............ 438/672 |
| 2005/0167656 | A1 * | 8/2005 | Sun et al. ............ 257/30 |
| 2005/0270832 | A1 * | 12/2005 | Chu et al. ............ 365/163 |

FOREIGN PATENT DOCUMENTS

KR    10-2004 0036426    4/2004
KR    10-2004 0038422    5/2004

* cited by examiner

*Primary Examiner*—B. William Baumeister
*Assistant Examiner*—Igwe U. Anya
(74) *Attorney, Agent, or Firm*—Ladas & Parry LLP

(57) ABSTRACT

Disclosed are a phase-change random access memory device and a method for manufacturing the same. The phase-change random access memory includes a first insulation layer having first contact holes, conductive plugs for filling the first contact holes, a second insulation layer having a second contact hole, and a bit line. Third and fourth insulation layers and a nitride layer are sequentially formed on the second insulation layer and have third contact holes. Bottom electrodes are provided to fill the third contact holes. An opening is formed in order to expose a part of the third insulation layer and a cavity is connected with the opening so as to expose a part of the bottom electrode. A phase-change layer pattern is connected to one side of the bottom electrode. A top electrode is formed on the phase-change layer pattern.

19 Claims, 5 Drawing Sheets

PHASE-CHANGE RANDOM ACCESS MEMORY DEVICE AND METHOD FOR MANUFACTURING THE SAME

BACKGROUND OF THE INVENTION

1. Field of the Invention

The present invention relates to a semiconductor memory device, and more particularly to a phase-change random access memory device and a method for manufacturing the same, capable of reducing an amount of current required for phase-changing a phase-change layer by reducing a contact area between a bottom electrode and the phase-change layer.

2. Description of the Prior Art

Semiconductor memory devices are mainly classified into RAM (random access memory) devices, such as DRAM (dynamic random access memory) devices and SRAM (static random access memory) devices, and ROM (read only memory) devices. The RAM devices have volatile characteristics so that data stored therein are automatically erased as time goes by. In addition, the RAM devices may allow data to be inputted thereto or outputted therefrom at a relative high speed. The ROM (read only memory) devices can permanently store data while allowing data to be inputted thereto or outputted therefrom at a relative low speed. Such memory devices may represent logic "0" or logic "1" depending on charges stored therein.

Herein, the DRAM device, which is a volatile memory device, is unable to retain data unless a refresh voltage is periodically applied thereto, so it requires higher charge storage capacity. For this reason, various attempts have been carried out in order to enlarge a surface area of a capacitor electrode. However, if the surface area of the capacitor electrode becomes enlarged, there is a difficulty to increase an integration degree of the DRAM device.

In contrast, a non-volatile memory device has a greater amount of charge storage capacity. Recently, demands for flash memory devices, such as EEPROM (electrically erasable and programmable ROM) devices, allowing data to be electrically inputted/outputted have been being substantially increased.

Such a flash memory cell generally has a vertical-stack type gate structure including a floating gate formed on a silicon substrate. Typically, A multi-gate structure includes at least one tunnel oxide layer or dielectric layer, and a control gate formed at an upper portion or a peripheral portion of the floating gate. Writing or erasing of data in the flash memory cell can be achieved by allowing charges to pass through the tunnel oxide layer. At this time, an operation voltage must be higher than a supply voltage. For this reason, the flash memory devices must be equipped with booster circuits so as to generate voltages required for writing or erasing the data.

Thus, there have been various attempts to develop new memory devices having non-volatile and random access characteristics capable of increasing the integration degree thereof with a more simple structure. One example of such new memory devices is a phase-change random access memory (PRAM) device.

The phase-change random access memory device employs a chalcogenide layer as a phase-change layer. The chalcogenide layer is a compound layer including Ge, Sb and Te (hereinafter, referred to as a "GST layer"). The GST layer is electrically switched between an amorphous state and a crystalline state according to current applied thereto, that is, Joule heat applied thereto.

Figure 1:
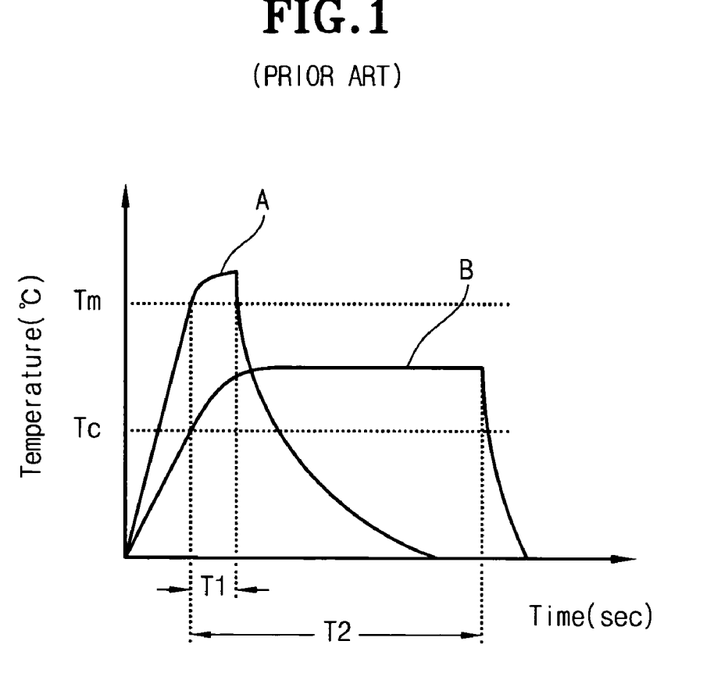
FIG. 1 is a graph for explaining a method of programming or erasing data in a phase-change random access memory device.

FIG. 1 is a graph for explaining a method of programming or erasing data in a phase-change random access memory device, in which a transverse axis represents a time and a longitudinal axis represents a temperature of a phase-change layer.

As shown in FIG. 1, if the phase-change layer is rapidly quenched after the phase-change layer has been heated at a first predetermined temperature higher than a melting temperature (Tm) for a first period of time ($t_1$: first operation period), the phase-change layer is changed into an amorphous state (see, curve 'A'). In contrast, if the phase-change layer is quenched after the phase-change layer has been heated at a second predetermined temperature lower than the melting temperature (Tm) and higher than a crystallization temperature (Tc) for a second predetermined period of time ($t_2$: second operation period) longer than the first operation period $t_1$, the phase-change layer is changed into a crystalline state (see, curve 'B').

Herein, resistivity of the phase-change layer in the amorphous state is higher than that of the phase-change layer in the crystalline state. Therefore, it is possible to determine whether information stored in the phase-change random access memory cell is logic "1" or logic "0" by detecting current applied to the phase-change layer in a read mode.

As mentioned above, Joule heat is necessary in order to phase-change the phase-change layer. In a conventional phase-change random access memory device, if high density current is applied to a contact surface of the phase-change layer, the crystalline state of the contact surface of the phase-change layer may be changed. At this time, it is noted that current density required for phase-changing the phase-change layer becomes lowered as the contact surface of the phase-change layer becomes reduced.

Figure 2:
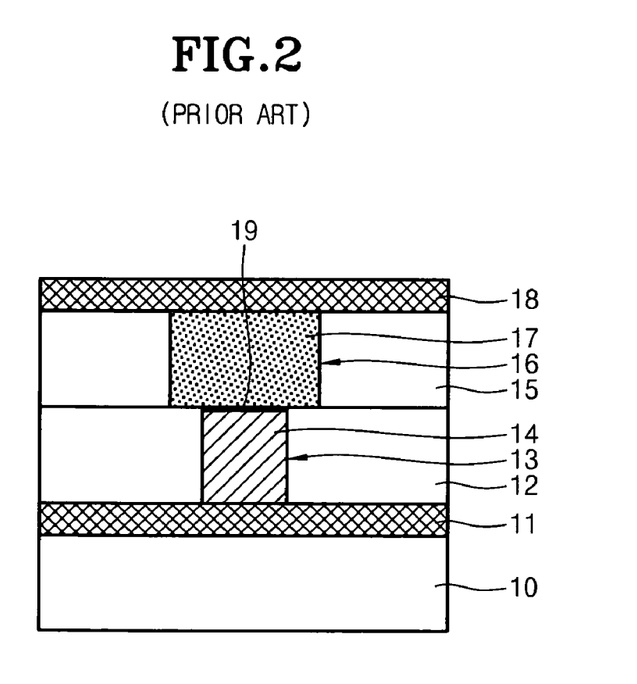
FIG. 2 is a sectional view for explaining a conventional phase-change random access memory device.

FIG. 2 is a sectional view for explaining a conventional phase-change random access memory device.

As shown in FIG. 2, the conventional phase-change random access memory device includes a semiconductor substrate 10 formed with a bottom electrode 11, a first insulation layer 12 formed on the bottom electrode 11 and having a first contact hole 13 for exposing a predetermined portion of the bottom electrode 11, a bottom electrode contact 14 for filling the first contact hole 13, a second insulation layer 15 formed on the first insulation layer 12 including the bottom electrode contact 14 and having a second contact hole 16 for exposing the bottom electrode contact 14, a phase-change layer 17 for filling the second contact hole 16, and a top electrode 18 formed on the second insulation layer 15 including the phase-change layer 17.

In such a conventional phase-change random access memory device, if current is applied between the bottom electrode 11 and the top electrode 18, the crystalline state of the phase-change layer 17 is changed at a contact surface 19 according to current intensity (that is, heat) applied to the contact surface 19 formed between the bottom electrode contact 14 and the phase-change layer 17. At this time, heat required for phase-changing the phase-change layer 17 may directly relate to the contact surface 19 formed between the bottom electrode contact 14 and the phase-change layer 17. Accordingly, it is necessary to minimize the size of the contact surface 19, if possible.

However, in the above conventional phase-change random access memory device, the bottom electrode 11 is connected to the phase-change layer 17 through the bottom electrode contact 14. Accordingly, the size of the contact surface between the bottom electrode contact 14 and the phase-change layer 17 is directly subject to a limitation of a photo process for the contact hole, so there is a difficulty to reduce the size of the contact surface. For this reason, an amount of current required for phase-changing the phase-change layer may increase.

SUMMARY OF THE INVENTION

Accordingly, the present invention has been made to solve the above-mentioned problems occurring in the prior art, and an object of the present invention is to provide a phase-change random access memory device and a method for manufacturing the same, capable of reducing an amount of current required for phase-changing a phase-change layer by minimizing a contact area between a bottom electrode and the phase-change layer.

In order to accomplish the above object, according to one aspect of the present invention, there is provided a phase-change random access memory device comprising: a first insulation layer formed on a semiconductor substrate including a predetermined bottom structure and having first contact holes for exposing a predetermined portion of the semiconductor substrate; conductive plugs for filling the first contact holes; a second insulation layer formed on the first insulation layer including the conductive plugs, the second insulation layer having a second contact hole for exposing a predetermined portion of the semiconductor substrate formed between the conductive plugs; a bit line formed on the second insulation layer such that the second contact hole is filled with the bit line; third and fourth insulation layers and a nitride layer, which are sequentially formed on the second insulation layer including the bit line and formed with third contact holes for exposing the conductive plugs; bottom electrodes for filling the third contact holes; an opening section formed in the nitride layer and the fourth insulation layer in order to expose a predetermined portion of the third insulation layer formed between the bottom electrodes; a cavity section connected with the opening section so as to expose a part of a sidewall of the bottom electrode; a phase-change layer pattern connected to one side of the bottom electrode while filling the opening section and the cavity section; and a top electrode formed on the phase-change layer pattern.

According to the preferred embodiment of the present invention, the third insulation layer includes one selected from the group consisting of High Density Plasma (HDP), Undoped Silicate Glass (USG), Spin-On-Glass (SOG), PhosphoSilicate Glass (PSG), BoroPhosphoSilicate Glass (BPSG), TetraEthylOrthosilicate (TEOS), and High temperature Low pressure Deposition (HLD) oxide layers and the fourth insulation layer includes an oxide layer having an etching rate higher than that of the third insulation layer. In addition, the phase-change layer pattern includes a $GeSb_2Te_4$ layer or a $Ge_2Sb_2Te_5$ layer, and the phase-change layer pattern has an "I" shape. The phase-change random access memory device further comprises a fifth insulation layer interposed between the nitride layer including the bottom electrode and the phase-change layer pattern.

In order to accomplish the above object, according to another aspect of the present invention, there is provided a method for manufacturing a phase-change random access memory device, the method comprising the steps of: forming a first insulation layer on a semiconductor substrate including a predetermined bottom structure and selectively etching the first insulation layer, thereby forming a first contact hole for exposing a predetermined portion of the semiconductor substrate; filling the first contact hole with a conductive layer, thereby forming conductive plugs, and forming a second insulation layer on the first insulation layer including the conductive plugs; selectively etching the second insulation layer and the first insulation layer, thereby forming a second contact hole for exposing a predetermined portion of the semiconductor substrate formed between the conductive plugs; forming a bit line on the second insulation layer such that the second contact hole is filled with the bit line; sequentially forming a third insulation layer, a fourth insulation layer having etching selectivity different from that of the third insulation layer, and a nitride layer on the second insulation layer including the bit line; selectively etching the nitride layer, the fourth insulation layer, the third insulation layer and the second insulation layer, thereby forming third contact holes; filling the third contact holes with a conductive layer, thereby forming bottom electrodes; forming a fifth insulation layer on the nitride layer including the bottom electrodes, and selectively etching the fifth insulation layer, the nitride layer, and the fourth insulation layer, thereby forming an opening section for exposing a predetermined portion of the third insulation layer formed between the bottom electrodes; performing a wet-etching process with regard to the remaining fourth insulation layer in order to form a cavity section, which is connected with the opening section while partially exposing sidewalls of the bottom electrodes; sequentially forming a phase-change layer and a top electrode conductive layer on the fifth insulation layer such that the opening section and the cavity section are filled with the phase-change layer and the top electrode conductive layer; and patterning the top electrode conductive layer and the phase-change layer, thereby forming a phase-change layer pattern and a top electrode connected to side portions of the bottom electrodes.

According to the preferred embodiment of the present invention, the step of forming the bit line on the second insulation layer includes the substeps of depositing a metal layer on the second insulation layer including the second contact hole such that the second contact hole is filled with the metal layer and patterning the metal layer. The fourth insulation layer includes an oxide layer having an etching rate higher than that of the third insulation layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described in detail with reference to accompanying drawings.

Figure 3:
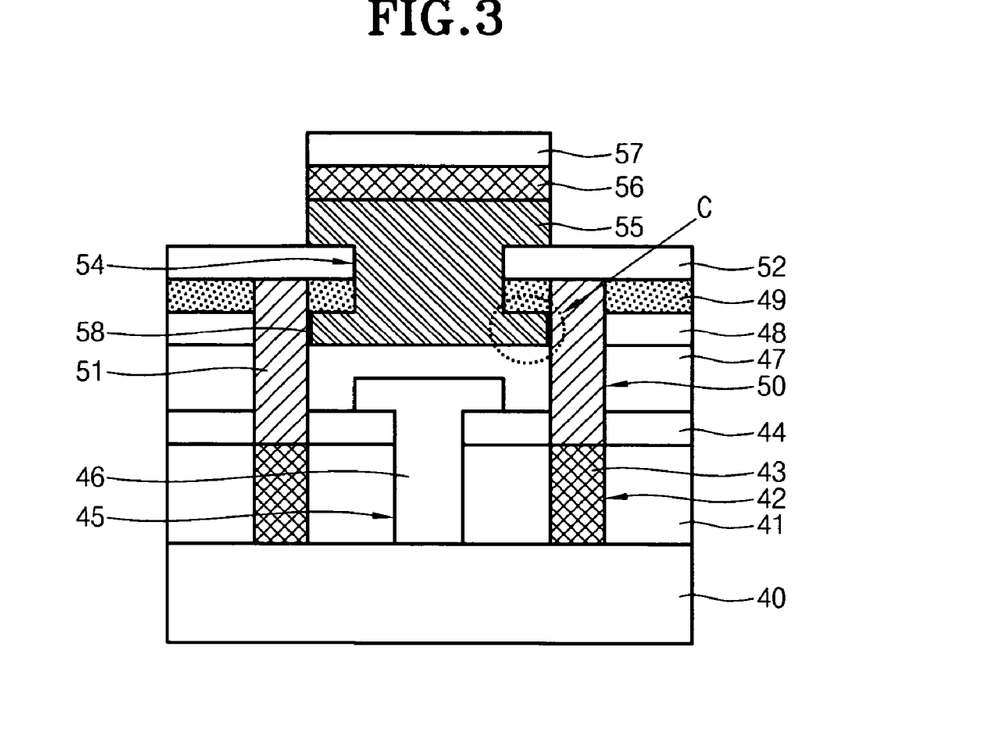
FIG. 3 is a sectional view for explaining a phase-change random access memory device according to one embodiment of the present invention.

FIG. 3 is a sectional view for explaining a phase-change random access memory device according to one embodiment of the present invention.

As shown in FIG. 3, the phase-change random access memory device according to one embodiment of the present invention includes a semiconductor substrate 40 having a predetermined bottom structure (not shown), a first insulation layer 41 formed on the semiconductor substrate 40 and having first contact holes 42 for exposing a predetermined portion of the semiconductor substrate 40, conductive plugs 43 for filling the first contact holes 42, a second insulation layer 44 formed on the first insulation layer 41 including the conductive plugs 43 and having a second contact hole 45 for exposing a predetermined portion of the semiconductor substrate 40 formed between the conductive plugs 43, and a bit line 46 formed on the second insulation layer 44 such that the second contact hole 45 is filled with the bit line 46. Third and fourth insulation layers 47 and 48 and a nitride layer 49 are sequentially formed on the second insulation layer 44 including the bit line 46 and have third contact holes 50 for exposing the conductive plugs 43. The phase-change random access memory device also includes bottom electrodes 51 for filling the third contact holes 50, an opening 54 formed in the nitride layer 49 and the fourth insulation layer 48 in order to expose a predetermined portion of the third insulation layer 47 formed between the bottom electrodes 51, a cavity C connected with the opening 54 so as to expose a part of a sidewall of the bottom electrode 51, an I-shape phase-change layer pattern 55 connected to one side of the bottom electrode while filling the opening 54 and the cavity C, and a top electrode 56 formed on the I-shape phase-change layer pattern 55.

Herein, a fifth insulation layer 52 is interposed between the nitride layer 49 including the bottom electrode 51 and the I-shape phase-change layer pattern 55. The fifth insulation layer 52 prevents an upper surface of the bottom electrode 51 from electrically making contact with the I-shape phase-change layer pattern 55.

In addition, a hard mask layer 57 is formed on the top electrode 56. The bottom electrodes 51 and the top electrode 56 are made from polysilicon-based materials or metallic materials.

In addition, the third insulation layer 47 includes one selected from the group consisting of HDP, USG, SOG, PSG, BPSG, TEOS, and HLD oxide layers. The fourth insulation layer 48 is made from an oxide layer having an etching rate higher than that of the third insulation layer 47. In addition, the phase-change layer pattern 55 is made from a GTS layer. At this timed, a $GeSb_2Te_4$ layer or a $Ge_2Sb_2Te_5$ layer can be used as the GST layer.

A contact surface 58 is formed between the I-shape phase-change layer pattern 55 and a sidewall of the bottom electrode 51. The size of the contact surface 58 depends on the thickness of the fourth insulation layer 48. The thickness of the fourth insulation layer 48 can be adjusted in a desired size through a deposition process. That is, since the size of the contact surface 58 is not influenced by a limitation of the photo process, the size of the contact surface 58 can be formed with a desired size through a deposition process beyond the limitation of the photo process.

Hereinafter, a method for fabricating the phase-change random access memory device shown in FIG. 3 will be described.

FIGS. 4a to 4f are sectional views for explaining the method for fabricating the phase-change random access memory device according to one embodiment of the present invention.

Figure 4A:
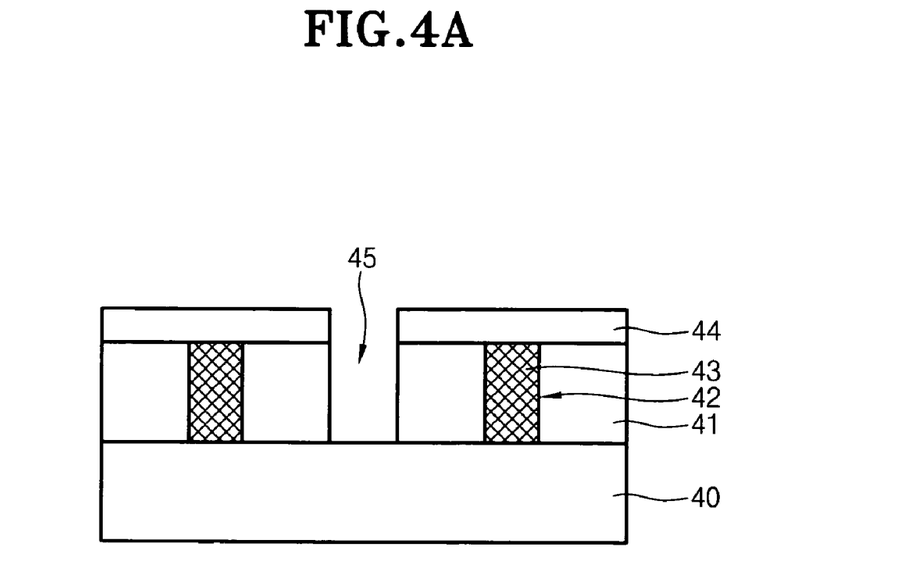
FIGS. 4a to 4f are sectional views for explaining a method for fabricating a phase-change random access memory device according to one embodiment of the present invention.

According to the method for fabricating the phase-change random access memory device of the present invention, as shown in FIG. 4a, the first insulation layer 41 is formed on the semiconductor substrate 40 including the predetermined bottom structure (not shown). Then, the first insulation layer 41 is selectively etched, thereby forming the first contact hole 42 for exposing a predetermined portion of the semiconductor substrate 40. In addition, the first contact hole 42 is filled with the conductive layer, thereby forming the conductive plugs 43. Then, after forming the second insulation layer 44 on the first insulation layer 41 including the conductive plugs 43, the second insulation layer 44 and the first insulation layer 41 are selectively etched, thereby forming the second contact hole 45 for exposing the predetermined portion of the semiconductor substrate 40 formed between the conductive plugs 43.

Figure 4B:
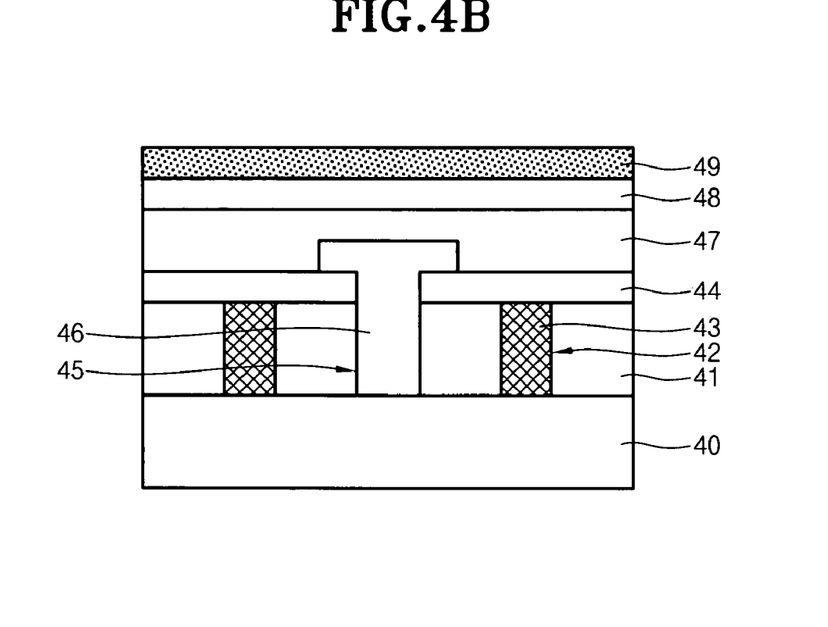

After that, as shown in FIG. 4b, a metal layer (not shown) is deposited on the second insulation layer 44 including the second contact hole 45 in such a manner that the second contact hole 45 is filled with the metal layer. Then, a bit line 46 is formed through patterning the metal layer. Thereafter, the third insulation layer 47 is formed on the second insulation layer 46 including the bit line 46.

In addition, the fourth insulation layer 48 having etching selectivity different from that of the third insulation layer 47 and the nitride layer 49 are sequentially formed on the third insulation layer 47. As mentioned above, the third insulation layer 47 includes one selected from the group consisting of HDP, USG, SOG, PSG, BPSG, TEOS, and HLD oxide layers. In addition, an oxide layer having an etching rate higher than that of the third insulation layer 47 is used as the fourth insulation layer 48.

In the meantime, the size of the contact surface formed between the bottom electrode and the phase-change layer through the next process may depend on the thickness of the fourth insulation layer 48. Accordingly, it is possible to reduce the size of the contact surface by minimizing the thickness of the fourth insulation layer 48. As mentioned above, since the thickness of the fourth insulation layer 48 can be formed in a desired size through the deposition process, it is possible to form the contact surface with a smaller size beyond the limitation of the photo process.

Figure 4C:
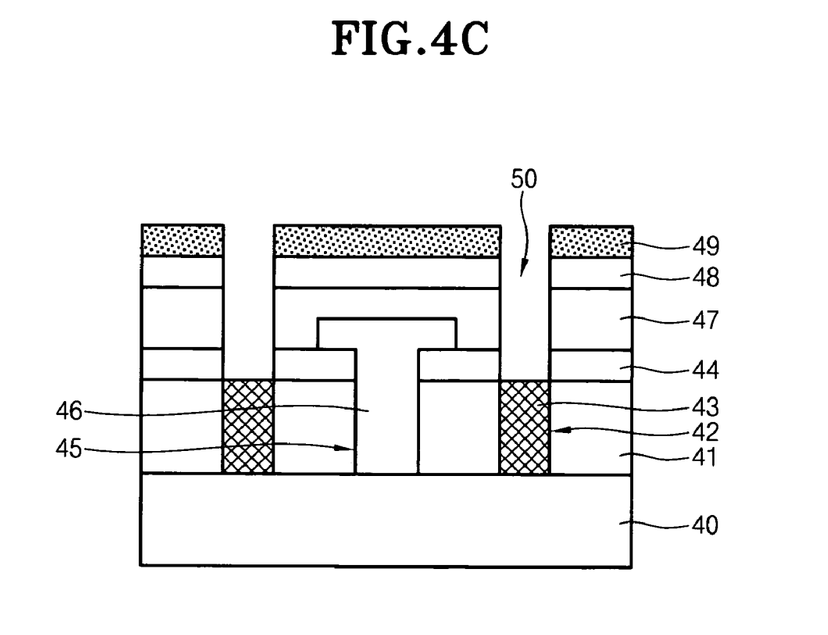

In addition, as shown in FIG. 4c, the nitride layer 49, the fourth insulation layer 48, the third insulation layer 47 and the second insulation layer 44 are selectively etched, thereby forming the third contact holes 50 such that the conductive plugs 43 are exposed through the third contact holes 50.

Figure 4D:
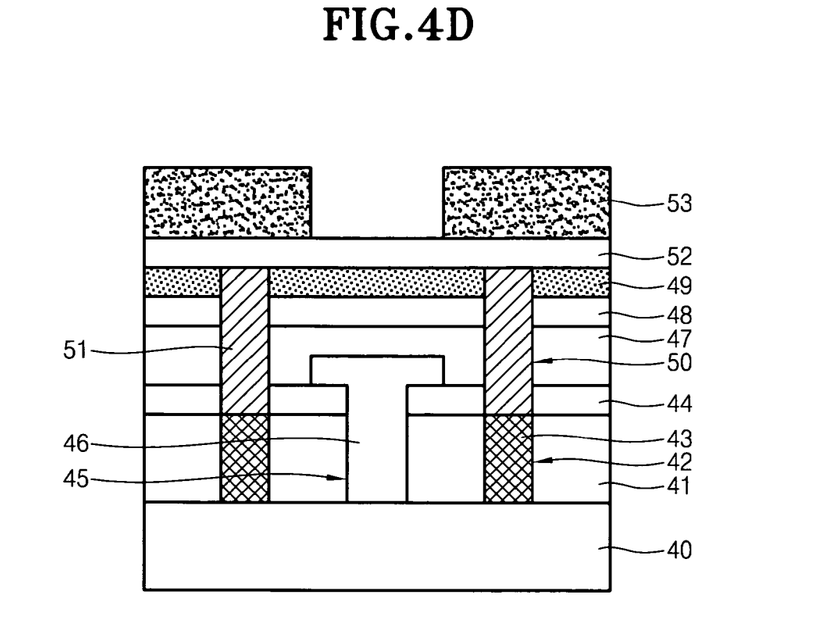

After that, as shown in FIG. 4d, the third contact holes 50 are filled with the conductive layer in order to form the bottom electrodes 51, which are electrically connected to the conductive plugs 43. As mentioned above, the bottom electrodes 51 are made from polysilicon-based materials or metallic materials.

Then, the fifth insulation layer 52 is formed on the nitride layer 48 including the bottom electrodes 51. After that, a photoresist layer pattern 53 is formed on the fifth insulation layer 52 in such a manner that a predetermined portion of the fifth insulation layer 52 formed between conductive plugs 43 can be exposed.

Figure 4E:
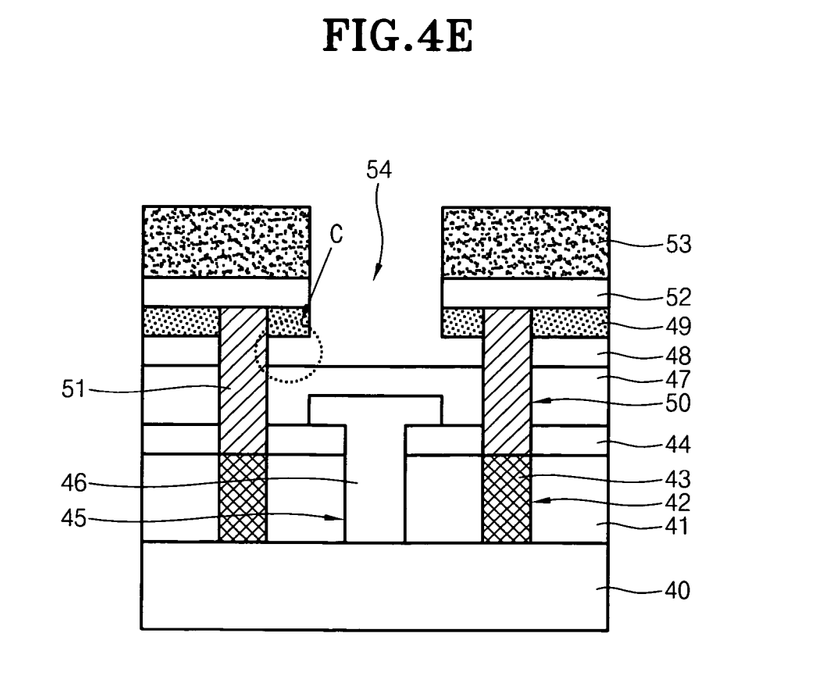

In addition, as shown in FIG. 4e, the fifth insulation layer 52, the nitride layer 49, and the fourth insulation layer 48 are etched by using the photoresist pattern 53 as an etching battier, thereby forming the opening 54. After that, the remaining fourth insulation layer 48 is wet-etched in order to form the cavity C, which is connected with the opening 54 while partially exposing sidewalls of the bottom electrodes 51. Since the fourth insulation layer 48 is made from the oxide layer having the etching rate higher than that of the third insulation layer, the third insulation layer 47 may act as an etch buffer during the wet etching process for the fourth insulation layer 48. In addition, since the nitride layer 49 has an etching rate lower than that of the fourth insulation layer 48 made from the oxide layer, the nitride layer 49 also acts as an etch buffer during the wet etching process for the fourth insulation layer 48.

Figure 4F:
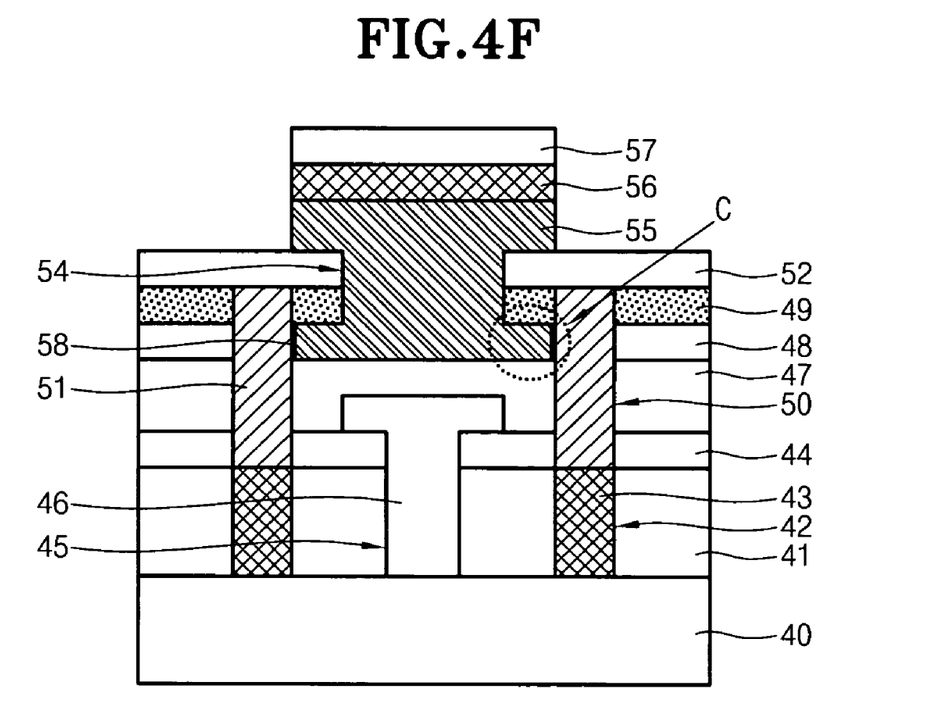

After that, as shown in FIG. 4*f*, the photoresist pattern is removed. Then, the phase-change layer (not shown), the top electrode conductive layer (not shown), and the hard mask layer are sequentially formed on the fifth insulation layer 52 such that the opening 54 and the cavity C can be filled with the phase-change layer, the top electrode conductive layer, and the hard mask layer. Then, the I-shape phase-change layer pattern 55 connected to one side of the bottom electrode 51, the top electrode 56 and the hard mask layer 57 are formed through patterning the above phase-change layer, the top electrode conductive layer, and the hard mask layer.

Herein, a GTS layer is used as the phase-change layer. The GST layer includes one selected from the group consisting of a $GeSb_2Te_4$ layer and a $Ge_2Sb_2Te_5$ layer. In addition, the top electrode conductive layer is made from polysilicon-based materials or metallic materials. The contact surface 58 is formed between the sidewall of the bottom electrode 51 and the I-shape phase-change layer pattern 55.

According to the phase-change random access memory device fabricated through the method of the present invention, the size of the contact surface 58 formed between the bottom electrode 51 and the I-shape phase-change layer pattern 55 may depend on the thickness of the fourth insulation layer 48. Accordingly, it is possible to reduce the size of the contact surface 58 by depositing the fourth insulation layer 48 such that the fourth insulation layer has a slim-sized thickness.

That is, since the size of the contact surface 58 is not influenced by the limitation of the photo process, the size of the contact surface 58 can be formed with a smaller size beyond the limitation of the photo process.

As described above, according to the present invention, the size of the contact surface formed between the bottom electrode and the phase-change layer may depend on the thickness of the insulation layer adjacent to the sidewall of the bottom electrode. That is, the thickness of the insulation layer determining the size of the contact surface is not influenced by the limitation of the photo process, so it is possible to form the contact surface with a smaller size beyond the limitation of the photo process.

Therefore, the phase-change random access memory device of the present invention can reduce the amount of current required for phase-changing the phase-change layer, that is, can reduce the amount of current required for operating a program of the phase-change random access memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change random access memory device comprising:
    a first insulation layer formed on a semiconductor substrate including a predetermined bottom structure and having first contact holes for exposing a predetermined portion of the semiconductor substrate;
    conductive plugs for filling the first contact holes;
    a second insulation layer formed on the first insulation layer including the conductive plugs, the second insulation layer having a second contact hole for exposing a predetermined portion of the semiconductor substrate formed between the conductive plugs;
    a bit line formed on the second insulation layer such that the second contact hole is filled with the bit line;
    third and fourth insulation layers and a nitride layer, which are sequentially formed on the second insulation layer including the bit line and formed with third contact holes for exposing the conductive plugs;
    bottom electrodes for filling the third contact holes;
    an opening section formed in the nitride layer and the fourth insulation layer in order to expose a predetermined portion of the third insulation layer formed between the bottom electrodes;
    a cavity section connected with the opening section so as to expose a part of a sidewall of each of the bottom electrodes;
    a phase-change layer pattern connected to one side of each of the bottom electrodes while filling the opening section and the cavity section; and
    a top electrode formed on the phase-change layer pattern.

2. The phase-change random access memory device as claimed in claim 1, wherein the third insulation layer includes one selected from the group consisting of High Density Plasma (HDP), Undoped Silicate Glass (USG), Spin-On-Glass (SOG), PhosphoSilicate Glass (PSG), BoroPhosphoSilicate Glass (BPSG), TetraEthylOrthoSilicate (TEOS), and High temperature Low pressure Deposition (HLD) oxide layers.

3. The phase-change random access memory device as claimed in claim 1, wherein the fourth insulation layer includes an oxide layer having an etching rate higher than that of the third insulation layer.

4. The phase-change random access memory device as claimed in claim 1, wherein the phase-change layer pattern includes a $GeSb_2Te_4$ layer or a $Ge_2Sb_2Te_5$ layer.

5. The phase-change random access memory device as claimed in claim 1, wherein the phase-change layer pattern has an "I" shape.

6. The phase-change random access memory device as claimed in claim 1, further comprising a fifth insulation layer interposed between the nitride layer including the bottom electrode and the phase-change layer pattern.

7. A method for manufacturing a phase-change random access memory device, the method comprising the steps of:
    i) forming a first insulation layer on a semiconductor substrate including a predetermined bottom structure and selectively etching the first insulation layer, thereby forming a first contact hole for exposing a predetermined portion of the semiconductor substrate;
    ii) filling the first contact hole with a conductive layer, thereby forming conductive plugs, and forming a second insulation layer on the first insulation layer including the conductive plugs;
    iii) selectively etching the second insulation layer and the first insulation layer, thereby forming a second contact hole for exposing a predetermined portion of the semiconductor substrate formed between the conductive plugs;
    iv) forming a bit line on the second insulation layer such that the second contact hole is filled with the bit line;
    v) sequentially forming a third insulation layer, a fourth insulation layer having etching selectivity different from that of the third insulation layer, and a nitride layer on the second insulation layer including the bit line;

vi) selectively etching the nitride layer, the fourth insulation layer, the third insulation layer and the second insulation layer, thereby forming third contact holes;

vii) filling the third contact holes with a conductive layer, thereby forming bottom electrodes;

viii) forming a fifth insulation layer on the nitride layer including the bottom electrodes, and selectively etching the fifth insulation layer, the nitride layer, and the fourth insulation layer, thereby forming an opening section for exposing a predetermined portion of the third insulation layer formed between the bottom electrodes;

ix) performing a wet-etching process with regard to the remaining fourth insulation layer in order to form a cavity section, which is connected with the opening section while partially exposing sidewalls of the bottom electrodes;

x) sequentially forming a phase-change layer and a top electrode conductive layer on the fifth insulation layer such that the opening section and the cavity section are filled with the phase-change layer and the top electrode conductive layer; and xi) patterning the top electrode conductive layer and the phase-change layer, thereby forming a phase-change layer pattern and a top electrode connected to side portions of the bottom electrodes.

8. The method as claimed in claim 7, wherein the step of forming the bit line on the second insulation layer includes the substeps of depositing a metal layer on the second insulation layer including the second contact hole such that the second contact hole is filled with the metal layer and patterning the metal layer.

9. The method as claimed in claim 7, wherein the fourth insulation layer includes an oxide layer having an etching rate higher than that of the third insulation layer.

10. A phase-change random access memory device comprising:
  a pair of bottom electrodes spaced away from each other;
  third and fourth insulation layers and a nitride layer, which are sequentially positioned around the pair of bottom electrodes wherein a portion of the third insulation layer and a section of the nitride layer are configured to expose a part of a sidewall of each of the bottom electrodes in which an overhanging ledge of the nitride layer and an undercut piece of the third insulation layer forming a cavity section exposing a part of the sidewall of each of the bottom electrodes;
  a phase-change layer pattern contacts within the cavity section with the sidewall of each bottom electrode and the phase-change layer pattern having an "I" shape; and
  a top electrode formed on the phase-change layer pattern.

11. The phase-change random access memory device of claim 10 further comprising a first insulation layer formed on a semiconductor substrate including a predetermined bottom structure and having first contact holes exposing a predetermined portion of the semiconductor substrate.

12. The phase-change random access memory device of claim 11 further conductive plugs filling the first contact holes.

13. The phase-change random access memory device of claim 12 further comprising a second insulation layer formed on the first insulation layer including the conductive plugs, the second insulation layer having a second contact hole exposing a predetermined portion of the semiconductor substrate formed between the conductive plugs.

14. The phase-change random access memory device of claim 13 further comprising a bit line formed on the second insulation layer such that the second contact hole is filled with the bit line.

15. The phase-change random access memory device of claim 14 wherein the third and fourth insulating layer and the nitride layer are sequentially formed on the second insulation layer including the bit line and formed with third contact holes exposing the conductive plugs.

16. The phase-change random access memory device of claim 15 wherein the bottom electrodes filling the third contact holes.

17. The phase-change random access memory device of claim 16 further comprising an opening section formed in the nitride layer and the fourth insulation layer exposing a predetermined portion of the third insulation layer formed between the bottom electrodes;
  a cavity section connected with the opening section so as to expose a part of a sidewall of each of the bottom electrodes;
  a phase-change layer pattern connected to one side of each of the bottom electrodes while filling the opening section and the cavity section; and
  a top electrode formed on the phase-change layer pattern.

18. The phase-change random access memory device of claim 10, wherein the third insulation layer includes one selected from the group consisting of High Density Plasma (HDP), Undoped Silicate Glass (USG), Spin-On-Glass (SOG), PhosphoSilicate Glass (PSG), BoroPhosphoSilicate Glass (BPSG), TetraEthylOrthoSilicate (TEOS), and High temperature Low pressure Deposition (HLD) oxide layers.

19. The phase-change random access memory device of claim 10, wherein the phase-change layer pattern is composed of a $GeSb_2Te_4$ layer or a $Ge_2Sb_2Te_5$ layer.

* * * * *